US012108540B2

(12) United States Patent
Woo et al.

(10) Patent No.: US 12,108,540 B2
(45) Date of Patent: Oct. 1, 2024

(54) CERAMIC SUBSTRATE MANUFACTURING METHOD

(71) Applicant: AMOSENSE CO.,LTD, Cheonan-si (KR)

(72) Inventors: Kyung Whan Woo, Gyeonggi-do (KR); Ji Hyung Lee, Pyeongtaek-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 127 days.

(21) Appl. No.: 17/611,813

(22) PCT Filed: May 14, 2020

(86) PCT No.: PCT/KR2020/006364
§ 371 (c)(1),
(2) Date: Nov. 16, 2021

(87) PCT Pub. No.: WO2020/235865
PCT Pub. Date: Nov. 26, 2020

(65) Prior Publication Data
US 2022/0240389 A1      Jul. 28, 2022

(30) Foreign Application Priority Data
May 17, 2019   (KR) .................. 10-2019-0058328

(51) Int. Cl.
*H05K 3/20* (2006.01)
*H01L 23/373* (2006.01)
(Continued)

(52) U.S. Cl.
CPC ............. *H05K 3/202* (2013.01); *H05K 3/205* (2013.01); *H05K 3/4641* (2013.01);
(Continued)

(58) Field of Classification Search
CPC ...... H05K 3/202; H05K 3/205; H05K 3/4641; H05K 2203/0425; H05K 3/381;
(Continued)

(56) References Cited

U.S. PATENT DOCUMENTS 4,913,784 A * 4/1990 Bogenschutz ......... H05K 3/381
                                                         205/163
5,473,138 A * 12/1995 Singh .................... H05K 3/381
                                                      219/121.68
(Continued)

FOREIGN PATENT DOCUMENTS

EP       1 699 080 A1    9/2006
JP       10-215053 A     8/1998
(Continued)

OTHER PUBLICATIONS

Miyazaki et al, "Effect of mechanical properties of the ceramic substrate on the thermal fatigue of Cu metallized ceramic substrates," 2016 IEEE 18th Electronics Packaging Technology Conference (EPTC), Singapore, 2016, pp. 268-270. (Year: 2016).*
(Continued)

*Primary Examiner* — A. Dexter Tugbang
(74) *Attorney, Agent, or Firm* — Maschoff Brennan

(57) ABSTRACT

A ceramic substrate manufacturing method is provided in which a copper sheet is etched and then bonded to a ceramic substrate, so that the ceramic substrate has reduced to overall processing time and improved reliability and product lifespan. The ceramic substrate manufacturing method includes the steps of: etching a copper sheet so as to prepare a metal substrate; etching a ceramic substrate so as to prepare a unit ceramic substrate; assembling the metal substrate and the unit ceramic substrate; bonding the metal substrate and the
(Continued)

unit ceramic substrate so as to form a stack; partially printing a metal paste on the surface of the stack; and sintering the metal paste.

4 Claims, 7 Drawing Sheets

(51) Int. Cl.
 *H05K 3/46* (2006.01)
 *H01L 21/48* (2006.01)
 *H05K 3/12* (2006.01)
 *H05K 3/38* (2006.01)

(52) U.S. Cl.
 CPC ...... *H01L 21/4867* (2013.01); *H01L 23/3735* (2013.01); *H05K 3/1283* (2013.01); *H05K 3/381* (2013.01); *H05K 2203/04* (2013.01); *H05K 2203/0425* (2013.01); *H05K 2203/0723* (2013.01)

(58) Field of Classification Search
 CPC ....... H05K 2203/04; H05K 2203/0235; H05K 3/0052; H05K 2203/0723; B23K 1/0016; B23K 35/0222; H01L 23/3735; H01L 21/486
 See application file for complete search history.

(56) References Cited

U.S. PATENT DOCUMENTS

| | | | |
|---|---|---|---|
| 7,608,917 B2 | 10/2009 | Kajiwara et al. | |
| 2007/0221404 A1* | 9/2007 | Das | H05K 3/4641 29/831 |
| 2013/0078408 A1* | 3/2013 | Niino | H05K 3/0052 29/829 |
| 2015/0216056 A1* | 7/2015 | Teshima | B23K 1/0016 228/124.1 |
| 2015/0289385 A1* | 10/2015 | Ishizuka | H05K 2203/04 228/124.1 |
| 2017/0368641 A1* | 12/2017 | Wiehl | B23K 35/0222 |

FOREIGN PATENT DOCUMENTS

| | | |
|---|---|---|
| JP | 2006253563 A * | 9/2006 |
| JP | 3949270 B2 | 7/2007 |
| JP | 2007-311441 A | 11/2007 |
| JP | 2011-238907 A | 11/2011 |
| JP | 2012-151518 A | 8/2012 |
| KR | 10-2017-0048998 A | 5/2017 |
| KR | 10-2018-0113050 A | 10/2018 |

OTHER PUBLICATIONS

KR Office Action dated Mar. 16, 2021 as received in Application No. 10-2019-0058328.
KR Office Action dated Sep. 29, 2021 as received in Application No. 10-2019-0058328.

* cited by examiner

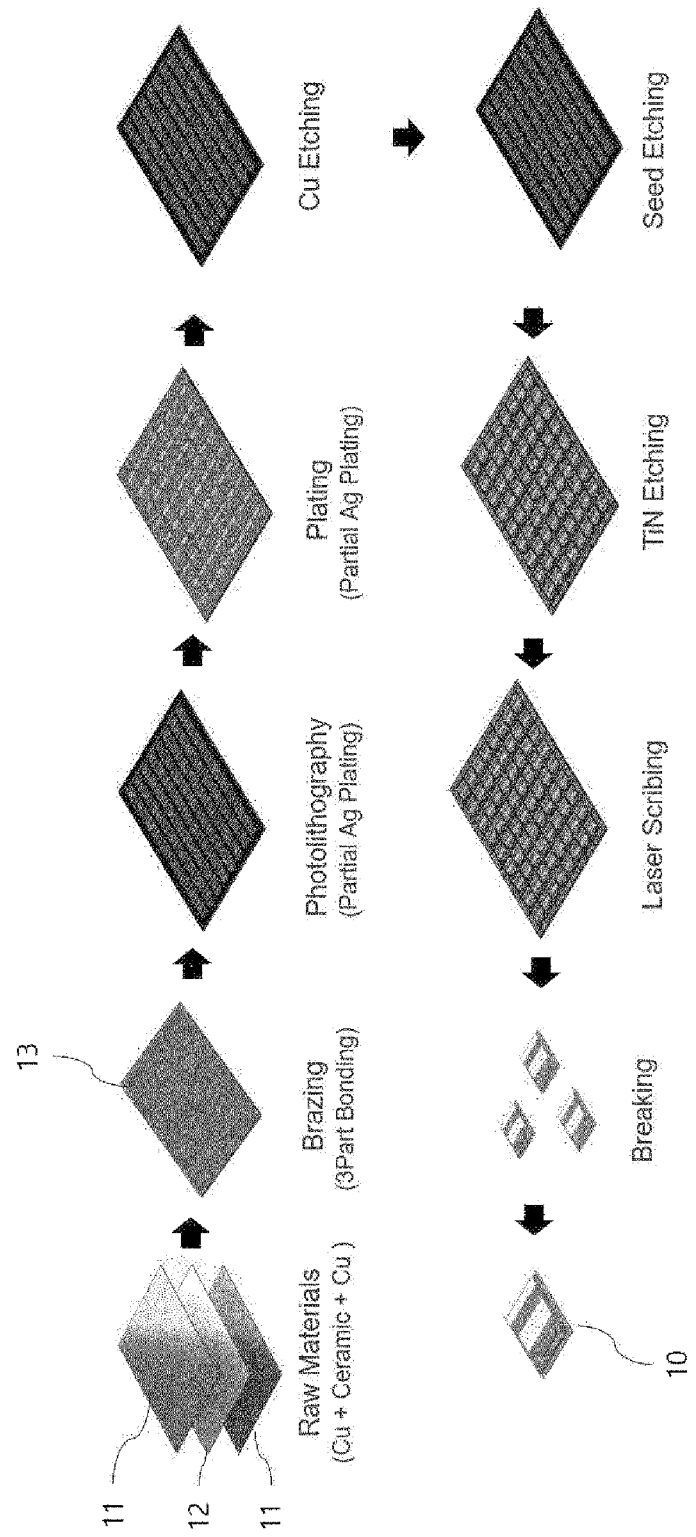

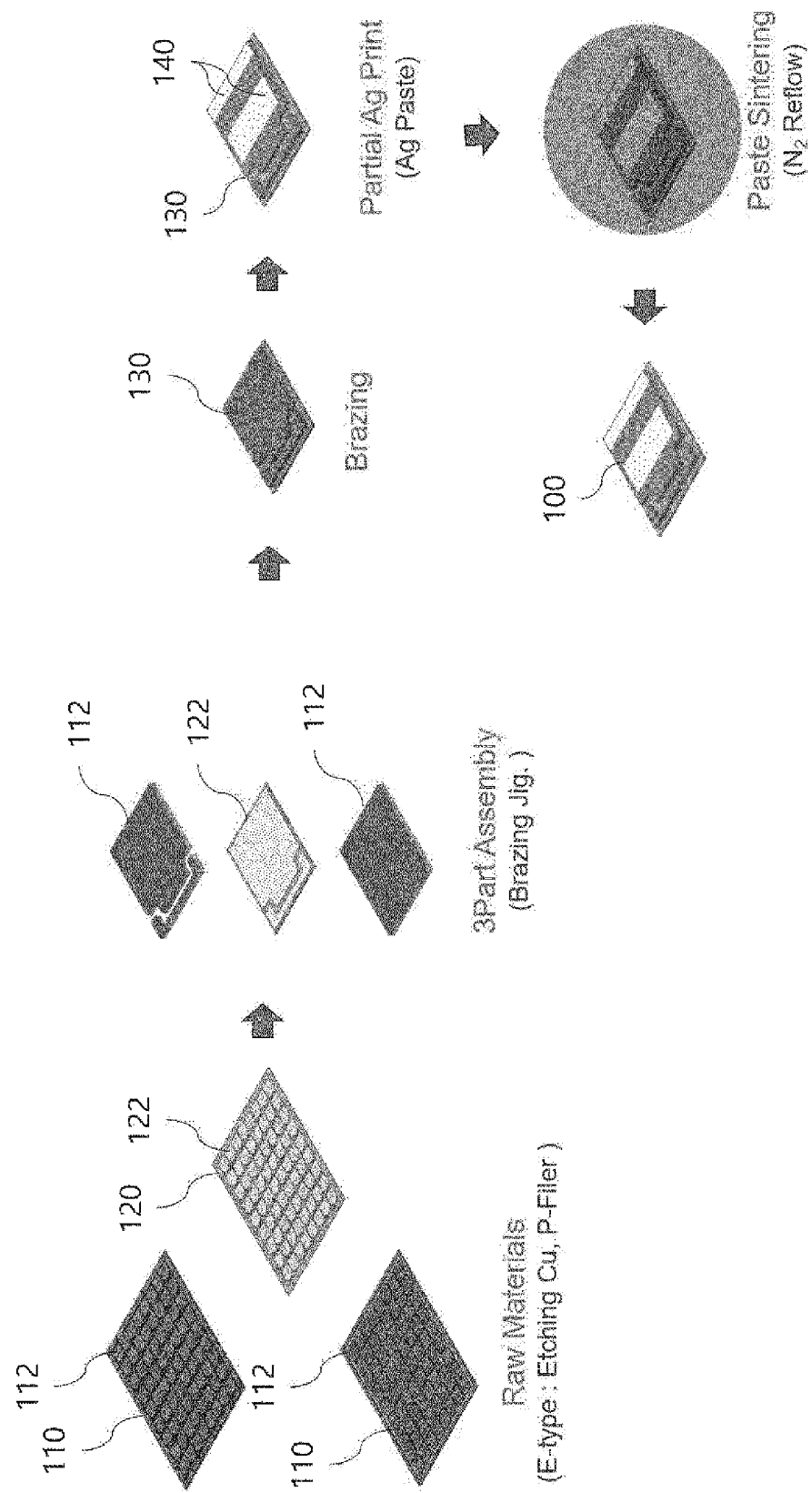
[FIG. 2]

[FIG. 3]
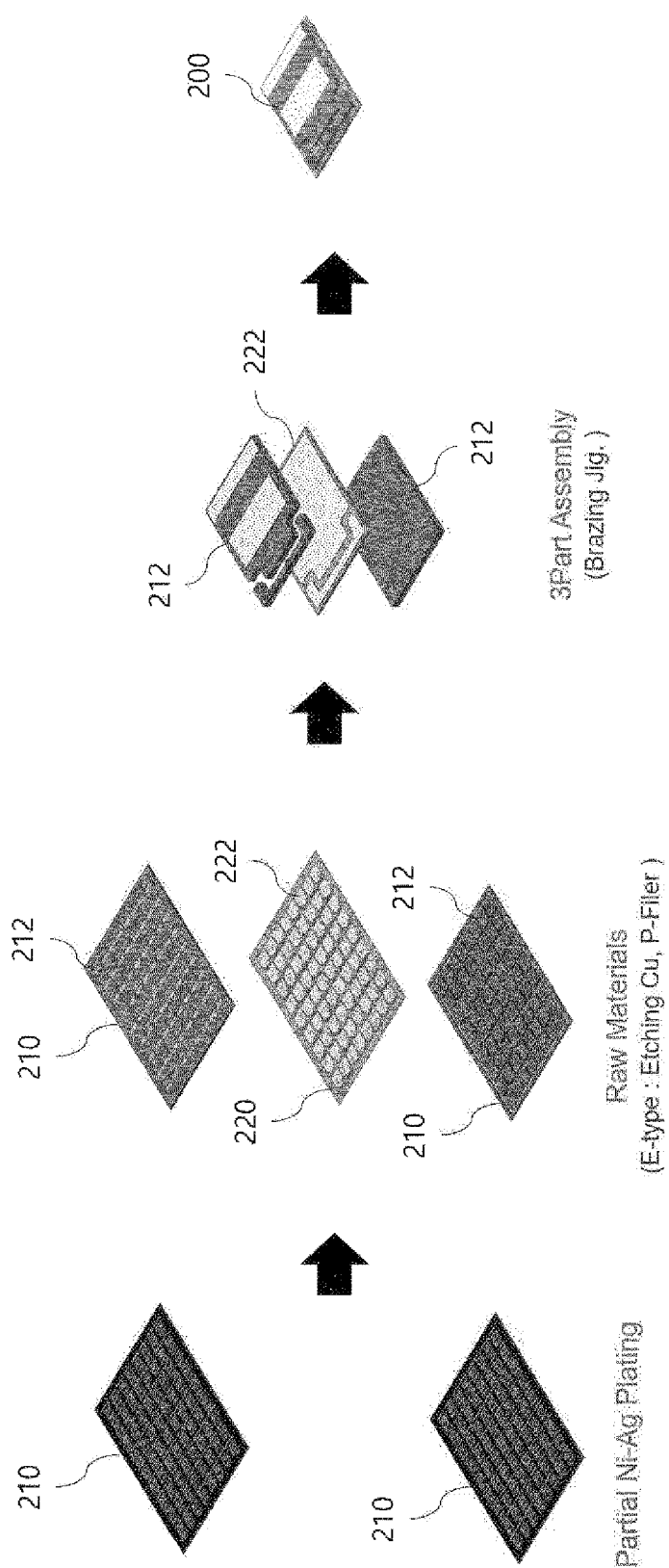

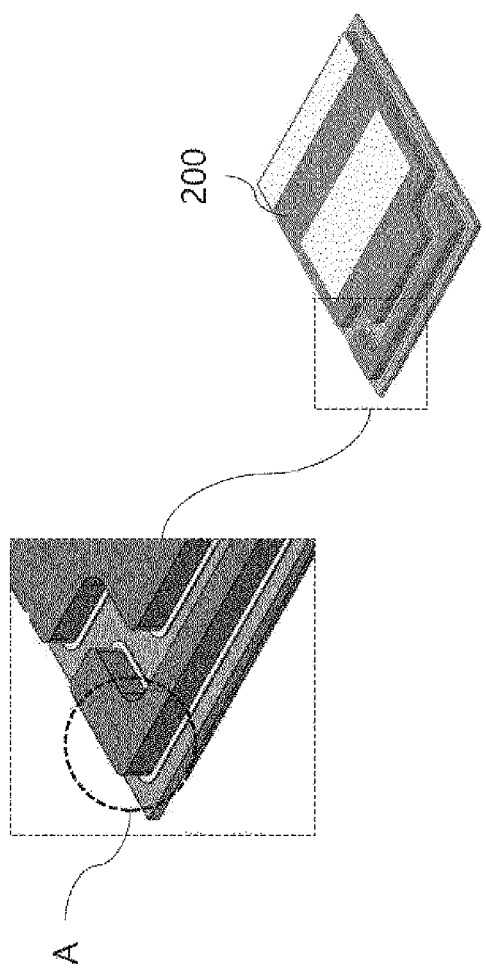
[FIG. 4]

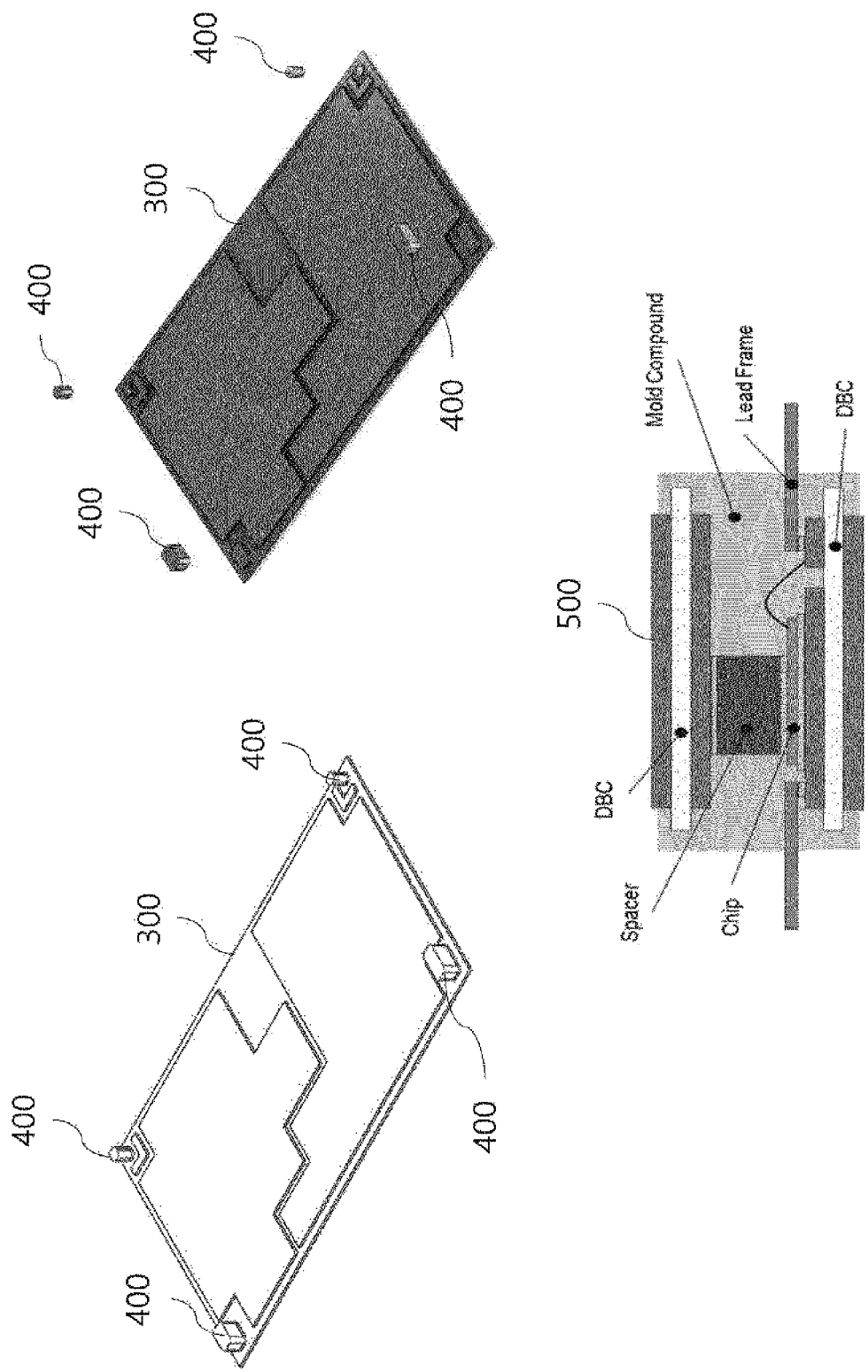

[FIG. 6]
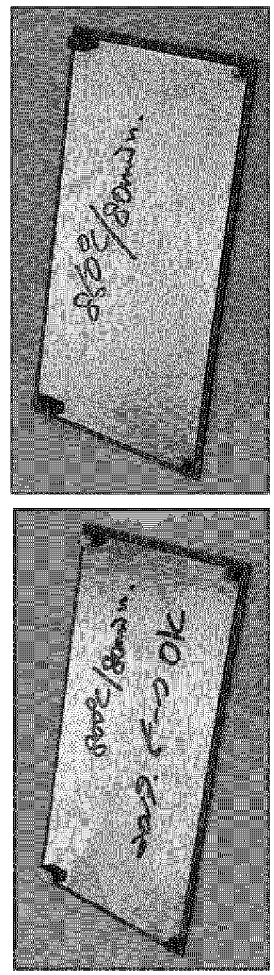
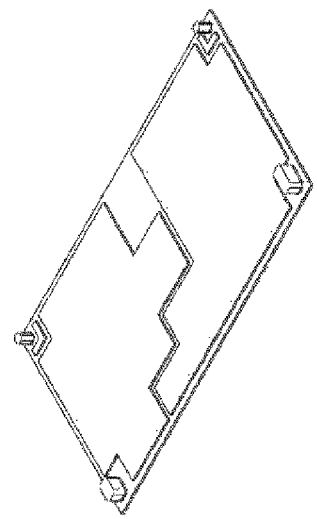
RELIABILITY AND PROCESS EXPERIMENT

[FIG. 7]
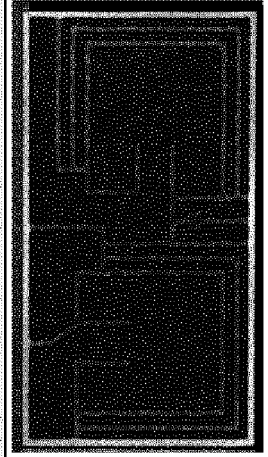

CERAMIC SUBSTRATE MANUFACTURING METHOD

TECHNICAL FIELD

The present disclosure relates to a ceramic substrate manufacturing method, and more specifically, to a ceramic substrate manufacturing method, which manufactures a ceramic substrate with a circuit formed on a surface of a ceramic substrate.

BACKGROUND ART

A ceramic substrate is formed by integrally attaching a metal foil such as a copper foil on a ceramic substrate. The ceramic substrate is generated by a manufacturing process such as active metal brazing (AMB) or direct bond copper (DBC), and can also be classified into a ceramic AMB substrate, a ceramic DBC substrate, etc. depending on a difference between the manufacturing processes.

The ceramic AMB substrate is manufactured in the active metal brazing (AMB) method for directly brazing a metal on a surface of the ceramic substrate without performing metallization (or metal wiring) on the surface of the ceramic substrate.

The ceramic AMB substrate is applied to the applications such as a vehicle, a wind turbine, and high-voltage DC transmission because it has high heat-dissipation property and reliability.

However, there is a problem in that the ceramic substrate has an increased etching time in an etching process and a distance (interval) between circuits when an electrode circuit is formed of a copper of 0.8 T or more.

In addition, the ceramic AMB substrate can be manufactured only by electroless plating using photolithography after the copper circuit is formed during partial plating. Therefore, there is a problem in that it is necessary to perform the electroless plating process after performing a treatment to prevent the side surface of the copper circuit from being plated.

In addition, if the ceramic AMB substrate is manufactured by dual side cooling (DSC), a spacer is interposed between two substrates, and the two substrates and the spacer are bonded by soldering. At this time, the ceramic AMB substrate contains many problems after manufacturing because the coefficient of thermal expansion and thermal conductivity of the spacer conflict with the ceramic AMB substrate.

In addition, the ceramic AMB substrate has a problem in that a bonding force is reduced because the substrate and the spacer are bonded by soldering.

DISCLOSURE

Technical Problem

The present disclosure is proposed to solve the conventional problems, and an object of the present disclosure is to provide a ceramic substrate manufacturing method, which etches and bonds a copper sheet on a ceramic substrate, thereby shortening the entire process time of the ceramic substrate and improving the reliability and lifespan of a product.

Another object of the present disclosure is to provide a ceramic substrate manufacturing method, which etches and then partially plates a copper sheet, thereby improving a closely contacting force between a circuit pattern and a copper sheet and removing smearing due to an electroless plating.

Still another object of the present disclosure is to provide a ceramic substrate manufacturing method, which bonds a ceramic substrate in a brazing method using a spacer with the thermal conductivity and coefficient of thermal expansion matched with those of the ceramic substrate, thereby securing reliability of the ceramic substrate.

Technical Solution

To achieve the objects, a ceramic substrate manufacturing method according to a first exemplary embodiment of the present disclosure includes preparing a metal substrate by etching a copper sheet, preparing a unit ceramic substrate by etching a ceramic substrate, assembling the metal substrate and the unit ceramic substrate, forming a stack by bonding the metal substrate and the unit ceramic substrate, partially printing a metal paste on a surface of the stack, and sintering the metal paste.

The assembling may include assembling the metal substrates and the unit ceramic substrate such that the metal substrates are disposed on both surfaces of the unit ceramic substrate using a brazing jig, and the metal paste may be an Ag paste.

To achieve the objects, a ceramic substrate manufacturing method according to a second exemplary embodiment of the present disclosure includes forming a plating substrate by plating a part of a copper sheet with a metal, preparing a metal substrate by etching the plating substrate, preparing a unit ceramic substrate by etching a ceramic substrate, and assembling the metal substrate and the unit ceramic substrate. The forming of the plating substrate may include forming a metal plating by partially electroplating the copper sheet with Ni and Ag, and the assembling may include assembling the metal substrates and the unit ceramic substrate such that the metal substrates are disposed on both surfaces of the unit ceramic substrate using a brazing jig.

To achieve the objects, a ceramic substrate manufacturing method according to a third exemplary embodiment of the present disclosure includes disposing a spacer between ceramic substrates and brazing and bonding the spacer and the ceramic substrates, in which the disposing includes disposing a spacer with a thermal conductivity and a coefficient of thermal expansion each equal to or greater than a reference value. At this time, the reference value of the thermal conductivity of the spacer can be 240 W/m·K, and the reference value of the coefficient of thermal expansion of the spacer can be 6.8 ppm/K.

Advantageous Effects

According to the ceramic manufacturing method according to the exemplary embodiment of the present disclosure, it is possible to etch and then bond the copper sheet on the ceramic substrate, thereby shortening the entire process time of the ceramic substrate.

According to the ceramic manufacturing method according to the exemplary embodiment of the present disclosure, it is possible to etch and then bond the copper sheet on the ceramic substrate to form a stress relief edge structure, thereby improving the reliability and lifespan of a product.

According to the ceramic manufacturing method according to the exemplary embodiment of the present disclosure, it is possible to etch and then partially plate the copper sheet, thereby improving the bonding force between the circuit pattern and the copper sheet and removing the smearing due to the electroless plating.

According to the ceramic manufacturing method according to the exemplary embodiment of the present disclosure, it is possible to etch and then partially plate the copper sheet. Therefore, the method can be applied even when the circuit pattern is formed of a thick copper.

According to the ceramic manufacturing method according to the exemplary embodiment of the present disclosure, it is possible to bond the ceramic substrates in the brazing method using the spacer with the excellent thermal properties of the coefficient of thermal expansion of 6.8 ppm/K and the thermal conductivity of 240 W/m·K. It is possible to secure the very excellent the bonding force and the high reliability and high thermal properties of the ceramic substrate.

DESCRIPTION OF DRAWINGS

FIG. 1 is a diagram for explaining a general ceramic substrate manufacturing process.

FIG. 2 is a diagram for explaining a ceramic substrate manufacturing method according to a first exemplary embodiment of the present disclosure.

FIGS. 3 and 4 are diagrams for explaining a ceramic substrate manufacturing method according to a second exemplary embodiment of the present disclosure.

FIGS. 5 to 7 are diagrams for explaining a ceramic substrate manufacturing method according to a third exemplary embodiment of the present disclosure.

DESCRIPTION OF EMBODIMENTS

Hereinafter, the most preferred exemplary embodiments of the present disclosure will be described with reference to the accompanying drawings in order to specifically describe the present disclosure such that those skilled in the art to which the present disclosure pertains may easily carry out the technical spirit of the present disclosure. First, in adding reference numerals to the components of each drawing, it should be noted that the same components have the same reference numerals, if possible, even if they are illustrated in different drawings. In addition, in describing the present disclosure, when it is determined that the detailed description of the related publicly-known configuration or function may obscure the subject matter of the present disclosure, the detailed description thereof will be omitted.

Referring to FIG. 1, in a general ceramic substrate manufacturing method, a ceramic AMB substrate 10 is manufactured through a raw material preparation process, a brazing process, a photolithography process, a plating process, a CU etching process, a seed etching process, a TiN etching process, a laser scribing process, and a breaking process.

In the raw material preparation process, a copper sheet 11 and a ceramic substrate 12 are prepared as raw materials. In the raw material preparation process, the copper sheets 11 are stacked on upper and lower surfaces of the ceramic substrate 12, respectively.

In the brazing process, the cooper sheets 11 and the ceramic substrate 12 stacked in the raw material preparation process are bonded by applying a constant temperature thereto. In the brazing process, a stack 13 in which the copper sheets 11 are stacked and bonded on both surfaces of the ceramic substrate 12 is formed by bonding the copper sheets 11 and the ceramic substrate 12.

A circuit pattern having a predetermined shape is formed on the stack 13 through the photolithography process, the plating process, the copper etching process, the seed etching process, the TiN etching process, and the laser scribing process.

In the breaking process, a final ceramic AMB substrate 10 is generated by breaking the stack 13 with the circuit pattern formed thereon in a unit size.

However, the general ceramic substrate manufacturing method has a problem of an increased etching time in the etching process and a distance (interval) between circuits if an electrode circuit is formed of a copper of 0.8 T or more.

Therefore, a ceramic substrate manufacturing method according to a first exemplary embodiment of the present disclosure solves the aforementioned problem by manufacturing a ceramic AMB substrate by etching a copper sheet and then bonding it to a ceramic substrate.

Referring to FIG. 2, in the ceramic substrate manufacturing method according to the first exemplary embodiment of the present disclosure, a ceramic AMB substrate is manufactured through a raw material preparation process, an assembly process, a brazing process, a partial Ag print process, and a paste sintering process.

In the raw material preparation process, a metal substrate 112 is prepared by etching a copper sheet 110 in a predetermined size and shape. In the raw material preparation process, a unit ceramic substrate 122 is prepared by etching a ceramic substrate 120 with a pattern formed thereon in a predetermined size and shape. At this time, in the raw material preparation process, the metal substrates 112 disposed on upper and lower surfaces of the unit ceramic substrate 122 may be etched in different sizes or shapes.

In the assembly process, the metal substrates 112 and the unit ceramic substrate 122 are assembled. At this time, in the assembly process, the metal substrates 112 are disposed on both surfaces of the unit ceramic substrate 122 using a brazing jig.

In the brazing process, the metal substrates 112 and the unit ceramic substrate 122 are bonded by applying a constant temperature thereto in a state where the metal substrates 112 are assembled on both surfaces of the unit ceramic substrate 122. In the brazing process, a stack 130 in which the metal substrates 112 are bonded on both surfaces of the unit ceramic substrate 122 is formed by bonding the metal substrates 112 and the unit ceramic substrate 122. At this time, in the brazing process, the metal substrates 112 and the unit ceramic substrate 122 are bonded using a filler metal. Here, the filler metal has, for example, a multilayer structure formed through plating with Cu and Ag.

In the partial print process, an Ag paste 140 is partially printed on a surface of the stack 130. In the paste sintering process, a ceramic AMB substrate 100 in a final state is manufactured by sintering the Ag paste 140 through an $N_2$ Reflow method.

As described above, the ceramic substrate manufacturing method according to the first exemplary embodiment of the present disclosure is a method for etching and then bonding a copper electrode on the ceramic like a mold punching method. According to the ceramic substrate manufacturing method, it is possible to manufacture a ceramic AMB substrate, which shortens the entire process time (processes such as seed etching and TiN etching are omitted), and improves the reliability and lifespan of a product by forming a stress relief edge structure.

Meanwhile, the general ceramic substrate manufacturing method has a problem in that it is necessary to perform the electroless plating process after performing a treatment to prevent the side surface of the copper circuit from being plated because the ceramic substrate is manufactured only by the electroless plating using photolithography after the copper circuit is formed upon partial plating.

Therefore, a ceramic substrate manufacturing method according to a second exemplary embodiment of the present disclosure solves the aforementioned problem by manufacturing a ceramic AMB substrate by etching and then partially plating a copper sheet.

Referring to FIGS. 3 and 4, in ceramic substrate manufacturing method according to the second exemplary embodiment of the present disclosure, a ceramic AMB substrate is manufactured through a partial Ni—Ag plating process, a raw material preparation process, and an assembly process.

The partial Ni—Ag plating process includes partially plating a copper sheet with Ni and Ag. At this time, in the partial Ni—Ag plating process, a plating substrate 210 with the copper sheet partially plated with Ni and Ag is generated through a partial electroplating.

In the raw material preparation process, a metal substrate 212 is prepared by etching the plating substrate 210 in a predetermined size and shape. In the raw material preparation process, a unit ceramic substrate 222 is prepared by etching a ceramic substrate 220 with a pattern formed thereon in a predetermined size and shape.

In the assembly process, the metal substrates 212 and the unit ceramic substrate 222 are assembled. At this time, in the assembly process, a final ceramic AMB substrate 200 is manufactured by assembling the metal substrates 212 and the unit ceramic substrate 222 such that the metal substrates 212 are disposed on upper and lower surfaces of the unit ceramic substrate 222 using a brazing jig.

The ceramic substrate manufacturing method according to the second exemplary embodiment of the present disclosure is a method for etching a copper electrode in advance to bond it to the ceramic like a mold punching method. According to the ceramic substrate manufacturing method, it is possible to manufacture the ceramic AMB substrate 200, which shortens the entire process time (processes such as seed etching and TiN etching are omitted), and improves the reliability and lifespan of a product by forming a stress relief edge structure (A of FIG. 4).

In addition, according to the ceramic substrate manufacturing method according to the second exemplary embodiment of the present disclosure, the ceramic AMB substrate is manufactured by forming each of the raw materials in advance through the mold punching, and bonding the copper electrode etched by the etching on the ceramic with the pattern already formed at once. Therefore, it is possible to manufacture a thick copper electrode product that cannot be manufactured by the manufacturing method for forming the copper electrode using the conventional etching method, and provide many effects, such as implementing a structure of alleviating stress and removing void defects on the bonded surface.

Meanwhile, in the general ceramic substrate manufacturing method, the ceramic AMB substrate for dual side cooling (DSC) has many problems because the coefficient of thermal expansion and thermal conductivity of the spacer conflict with the ceramic AMB substrate, and has a problem of a reduced bonding force because the substrate and the spacer are bonded by soldering.

Therefore, a ceramic substrate manufacturing method according to a third exemplary embodiment of the present disclosure solves the aforementioned problem by manufacturing a ceramic AMB substrate for DSC by bonding ceramic substrates in a brazing method using a spacer with the coefficient of thermal expansion and the thermal conductivity matched with those of the ceramic AMB substrate.

Referring to FIG. 5, in the ceramic substrate manufacturing method according to the third exemplary embodiment of the present disclosure, a ceramic AMB substrate 500 for DSC is manufactured by bonding ceramic substrates 400 in a brazing method using a spacer 300 with excellent thermal properties of a coefficient of thermal expansion of 6.8 ppm/K and a thermal conductivity of 240 W/m·K. Here, the ceramic substrate 500 is, for example, the ceramic AMB substrate manufactured in the aforementioned ceramic substrate manufacturing method according to the first or second exemplary embodiment. Of course, the ceramic substrate 500 can also be a ceramic DBC substrate manufactured in another ceramic substrate manufacturing method.

Since the coefficient of thermal expansion and thermal conductivity of copper are 17 ppm/K and 390 W/m·K, respectively, when the ceramic substrates are bonded in the soldering process using the conventional spacer made of a Cu or CuMo material, there occurs a problem in which the ceramic substrates (DBC or AMB) are not bonded by a difference in the coefficient of thermal expansion.

Therefore, referring to FIGS. 6 and 7, in the ceramic substrate manufacturing method according to the third exemplary embodiment of the present disclosure, the ceramic AMB substrate 500 for DSC with the excellent bonding force and the high reliability and high thermal properties may be manufactured by bonding the ceramic substrates 400 through the brazing process using the spacer 300 with the thermal properties of the coefficient of thermal expansion of 6.8 ppm/K and the thermal conductivity of 240 W/m·K.

Although the preferred exemplary embodiments of the present disclosure have been described above, it is understood that the present disclosure may be modified in various forms, and those skilled in the art may carry out various modified examples and changed examples without departing from the scope of the claims of the present disclosure.

The invention claimed is:
1. A ceramic substrate manufacturing method, the method comprising:
preparing metal substrates separated into two or more parts by etching copper sheets;
preparing a unit ceramic substrate with protruding patterns separated into two or more parts corresponding to a shape of the metal substrates by etching a ceramic substrate including the unit ceramic substrate;
assembling each of the metal substrates at a position corresponding to the protruding patterns of the unit ceramic substrate;
forming a stack by bonding the metal substrates and the unit ceramic substrate;
partially printing a metal paste on a surface of the stack; and
sintering the metal paste,
wherein the assembling comprises assembling the metal substrates and the unit ceramic substrate such that the metal substrates are disposed on both surfaces of the unit ceramic substrate using a brazing jig.
2. The method of claim 1,
wherein the metal paste is an Ag paste.
3. A ceramic substrate manufacturing method, the method comprising:
forming plating substrates by plating a part of copper sheets with a metal;

preparing metal substrates separated into two or more parts by etching the plating substrates;

preparing a unit ceramic substrate with protruding patterns separated into two or more parts corresponding to a shape of the metal substrates by etching a ceramic substrate including the unit ceramic substrate; and assembling each of the metal substrates at a position corresponding to the protruding patterns of the unit ceramic substrate, wherein the assembling comprises assembling the metal substrates and the unit ceramic substrate such that the metal substrates are disposed on both surfaces of the unit ceramic substrate using a brazing jig.

4. The method of claim 3, wherein the forming of the plating substrates comprises forming the plating substrates by partially electroplating the copper sheet with Ni and Ag.

* * * * *